(12) United States Patent
Van Den Brink et al.

(10) Patent No.: US 6,593,740 B1
(45) Date of Patent: Jul. 15, 2003

(54) MAGNETIC RESONANCE IMAGING METHOD WITH A DECAY TIME FUNCTION OF SUB-SAMPLED ACQUISITION DATA

(75) Inventors: Johan Van Den Brink, Eindhoven (NL); Romhild Martijn Hoogeveen, Eindhoven (NL); Paulus Johannes Maria Folkers, Eindhoven (NL); Klaas Paul Pruessmann, Zurich (CH); Markus Weiger, Dietikon (CH)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/572,992

(22) Filed: May 17, 2000

(30) Foreign Application Priority Data

May 20, 1999 (EP) .............................. 99201646

(51) Int. Cl.⁷ ................................................ G01V 3/00
(52) U.S. Cl. ....................................... 324/307; 324/309
(58) Field of Search ................................ 324/307, 309, 324/322, 318

(56) References Cited

U.S. PATENT DOCUMENTS

| | | | | |
|---|---|---|---|---|
| 4,528,509 A | * | 7/1985 | Radda et al. | 324/309 |
| 4,604,579 A | * | 8/1986 | Cannon et al. | 324/309 |
| 4,825,162 A | * | 4/1989 | Roemer et al. | 324/318 |
| 5,808,467 A | * | 9/1998 | Ochi et al. | 324/309 |
| 5,910,728 A | * | 6/1999 | Sodickson | 324/309 |
| 6,326,786 B1 | * | 12/2001 | Pruessmann et al. | 324/312 |
| 6,377,045 B1 | * | 4/2002 | Van Den Brink et al. | 324/307 |

OTHER PUBLICATIONS

D. K. Sodickson et al.: "Signal–to–Noise Ratio and Signal–to–Noise Efficiency in SMASH Imaging" Proceedings of the International Society for Magnetic Resonance in Medicine, Sixth Scientific Meeting and Exhibition, Sydney, Australia, Apr. 18–24, 1998, vol. 3, p. 1957.

P.M. Jakob et al: "Cardiac Imaging with SMASH" Proceedings of the International Society for Magnetic Resonance in Medicine, Sixth Scientific Meeting and Exhibition, Sydney, Australia, Apr. 18–24, 1998, vol. 1, p. 16.

M. A. Griswold et al: "Alternative EPI Acquisition Strategies Using SMASH" Proceedings of the International Society for Magnetic Resonance in Medicine, Sixth Scientific Meeting and Exhibition, Sydney, Australia, Apr. 18–24, 1998, vol. 1, p. 423.

Kwiat D et al: "Preliminary Experimental Evaluation of an Inverse Source Imaging Procedure Using a Decoupled Coil Detector Array in Magnetic Resonance Imaging" Medical Engineering & Physics, GB, Butterworth–Heinemann, vol. 17, No. 4, Jun. 1, 1995, pp. 257–263.

McKinnon G C: "Ultrafast Interleaved Gradient–Echo–Planar Imaging on a Standard Scanner" Magnetic Resonance in Medicine, US, Academic Press, Duluth, MN, vol. 30, No. 5, Nov. 1, 1993, pp. 609–616.

M. R. Prince et al: "3D Contrast MR Angiography", 1999, Springer–Verlag, Berlin p. 6–p. 9.

* cited by examiner

*Primary Examiner*—Edward Lefkowitz
*Assistant Examiner*—Dixomara Vargas
(74) *Attorney, Agent, or Firm*—John Vodopia

(57) ABSTRACT

The degree of sub-sampling in magnetic resonance imaging is such that the ensuing acquisition time for receiving (echo) series of magnetic resonance signals due to an individual RF excitation is shorter than the decay time of such magnetic resonance signals. Preferably, a segmented scan of the k space is performed, the number of segments and the number of lines scanned in each segment being adjustable and a predetermined total number of lines being scanned. Preferably, a small number of segments is used such that the acquisition time for receiving the magnetic resonance signals for the complete magnetic resonance image is shorter than the process time of the dynamic process involved.

7 Claims, 2 Drawing Sheets

MAGNETIC RESONANCE IMAGING METHOD WITH A DECAY TIME FUNCTION OF SUB-SAMPLED ACQUISITION DATA

BACKGROUND OF THE INVENTION

A magnetic resonance imaging method utilizes a coil sensitivity profile.

The article "Coil Sensitivity Encoding for Fast MRI" by K. P. Pruessmann et al. in Proceedings ISMRM (1998), page 579, deals with a magnetic resonance imaging method involving sub-sampled acquisition of magnetic resonance signals.

The known magnetic resonance imaging method is used in the so-called SENSE technique. In order to form a magnetic resonance image of an object, for example a patient to be examined, the object is arranged in a steady, preferably as spatially uniform as possible magnetic field, so that magnetic nuclear spin polarization is generated. Nuclear spins are excited in the object by one or more RF excitation pulses. Due to precession and relaxation of the nuclear spin polarization, magnetic resonance signals are emitted. The magnetic resonance signals are received by the receiving coils with sub-sampled scanning of the k space of wave vectors of the magnetic resonance signals for a given spatial resolution of the magnetic resonance image. Respective receiving coil images are reconstructed from the sub-sampled magnetic resonance signals acquired by the individual receiving coils. Due to the sub-sampling, such receiving coil images usually contain artefacts such as so-called aliasing effects. A final magnetic resonance image in which the artefacts due to sub-sampling, as they occur in the receiving coil images, have been significantly reduced or even completely eliminated is derived from the receiving coil images and on the basis of the spatial sensitivity profiles of the receiving coils.

SUMMARY OF THE INVENTION

It is an object of the invention to provide a magnetic resonance imaging method enabling the formation of one or more successive magnetic resonance images whereby dynamic processes taking place in the object to be examined can be accurately followed. It is another object of the invention to provide a magnetic resonance imaging method enabling the formation of magnetic resonance images which contain hardly any disturbances due to physical or physiological processes or, for example, motion in or of the object to be examined.

This object is achieved by means of a magnetic resonance imaging method according to the invention wherein an RF excitation pulse is generated, a series of magnetic resonance signals which are due mainly to the RF excitation pulse is acquired in a sub-sampled fashion by means of a set of one or more receiving coils during an acquisition time, a magnetic resonance image is derived from the sub-sampled magnetic resonance signals and on the basis of the spatial coil sensitivity profile of the set of receiving coils, and wherein the degree of sub-sampling is chosen to be such that the acquisition time remains below an upper limit, which upper limit is a predetermined function of the decay time in which a significant decay of the magnetic resonance signals occurs.

As the degree of sub-sampling applied is higher, the time required for the acquisition of the magnetic resonance signals will be shorter. The sub-sampling is then always related to the scanning of the k space in order to form the magnetic resonance image with a given spatial resolution. As the degree of sub-sampling applied is higher, fewer magnetic resonance signals will have to be acquired so as to reconstruct the magnetic resonance image with a high spatial resolution. According to the invention the degree of sub-sampling is chosen to be such that the sub-sampled magnetic resonance signals can be acquired within such a short acquisition time that hardly any or no decay of the magnetic resonance signals occurs, notably due to the dephasing of the excited nuclear spins. The decay of the magnetic resonance signals becomes manifest as a decrease of the signal levels of successive magnetic resonance signals in a series. If no steps were taken, such a decrease would cause disturbances in the magnetic resonance image. The decay of the magnetic resonance signals is usually caused by a disturbance of the phase relation of the local precessional magnetization. An important cause is $T_2$ or $T_2^*$ dephasing of the excited spins. Dephasing may also occur due to diffusion of the excited spins. Moreover, dephasing is caused by eddy currents and/or by chemically induced frequency shift, notably the so-called water-fat shift. Inhomogeneities in the steady magnetic field and inhomogeneities in the composition of the object to be examined cause dephasing of the magnetic moments of the excited spins. Such dephasing occurs notably due to the so-called $T_2$ relaxation of the excited spins or as a loss of phase coherence due to diffusion of the excited spins. Due to such dephasing, the amplitude of successive magnetic resonance signals decreases. Notably successive MR echo signals, generated due to an individual RF excitation pulse and a subsequent RF refocusing pulse and/or read-out gradients, have an amplitude which becomes lower as the MR echo signals are emitted later after the RF excitation pulse.

When a magnetic resonance image is formed while a contrast agent is administered to the patient to be examined, in principle decay of the magnetic resonance signals occurs because after some time the contrast agent disappears from the part of the patient to be examined, notably from a part of the blood vessels. Because the concentration of the contrast medium decreases in, for example the blood vessels, the signal level of the magnetic resonance signals decreases. According to the invention the degree of sub-sampling can be chosen to be so high that the acquisition time is significantly shorter than the time in which the magnetic resonance signals decay significantly due to a decrease of the presence of the concentration of the administered contrast agent in, for example the blood vessels. The shorter the acquisition time with respect to the relevant decay time, the less decay of the magnetic resonance signals will occur and hence the higher the diagnostic quality of the magnetic resonance image will be. The preferred duration of the acquisition time used is dependent on the circumstances in which the magnetic resonance image is formed and on the desired diagnostic quality.

Furthermore, decay of the magnetic resonance signals is also caused by motion of or within the patient to be examined. Such motion occurs, for example at the end of a period during which the patient has held his or her breath. During exhaling motions occur in the body of the patient to be examined which cause dephasing of the excited spins.

According to the invention the acquisition time can be kept so short that hardly any signal decay of the magnetic resonance signals occurs. It is thus achieved that the degree of disturbance due to signal decay, notably due to the dephasing, is significantly reduced in the magnetic resonance image reconstructed from the magnetic resonance signals and on the basis of the coil sensitivity profiles. The decay time is dependent on the main causes of the signal decay. For example, when the signal decay is caused mainly by dephasing with the dephasing time $T_2$ or $T_2^*$, good results are obtained by taking $2T_2$ and $2T_2^*$, respectively, as the upper limit for the acquisition time. A high diagnostic quality is thus achieved for the magnetic resonance image, i.e. small details are reproduced in the magnetic resonance image in such a manner that they can still be suitably distinguished in space.

The magnetic resonance image can be derived from the sub-sampled magnetic resonance signals in various manners without giving rise to serious disturbances due to the sub-sampling. For example, receiving coil images are reconstructed from the magnetic resonance signals from individual receiving coils.

The time required for acquisition of the magnetic resonance (MR) signals is reduced by employing sub-sampling of the MR-signals. Such sub-sampling involves a reduction in k-space of the number of sampled points which can be achieved in various ways. Notably, the MR signals are picked-up through signal channels pertaining to several receiver antennae, such as receiver coils, preferably surface coils. Acquisition through several; signal channels enables parallel acquisition of signals so as to further reduce the signal acquisition time.

Owing to the sub-sampling, sampled data contain contributions from several positions in the object being imaged. The magnetic resonance image is reconstructed from the sub-sampled MR-signals with the use of a sensitivity profile associated with the signal channels. Notably, the sensitivity profile is for example the spatial sensitivity profile of the receiver antennae, such as reciever coils. Preferably, surface coils are employed as the receiver antennae. The reconstructed magnetic resonance image may be considered as being composed of a large number of spatial harmonic components which are associated with brightness/contrast variations at respective wavelengths. The resolution of the magnetic resonance image is determined by the smallest wavelength, that is by the highest wavenumber (k-value) .The largest wavelength, i.e. the smallest wavenumber, involved, is the field-of-view (FOV) of the magnetic resonance image. The resolution is determined by the ratio of the field-of-view and the number of samples. The sub sampling may be achieved in that respective receiver antennae acquire MR signals such that their resolution in k-space is coarser than required for the resolution of the magnetic resonance image. The smallest wavenumber sampled, i.e. the minimum step-size in k-space, is increased while the largest wavenumber sampled is maintained. Hence, the image resolution remains the same when applying sub-sampling, while the minimum k-space step increases, i.e. the FOV decreases. The sub-sampling may be achieved by reduction of the sample density in k-space, for instance by skipping lines in the scanning of k-space so that lines in k-space are scanned which are more widely separated than required for the resolution of the magnetic resonance image. The sub-sampling may be achieved by reducing the field-of-view while maintaining the largest k-value so that the number of sampled points is accordingly reduced. Owing to the reduced field-of-view sampled data contain contributions from several positions in the object being imaged. Notably, when receiver coil images are reconstructed from sub-sampled MR-signals from respective receiver coils, such receiver coil images contain aliasing artefacts caused by the reduced field-of-view. From the receiver coil images and the sensitivity profiles the contributions in individual positions of the receiver coil images from different positions in the image are disentangled and the magnetic resonance image is reconstructed. This MR-imaging method is known as such under the acronym SENSE-method. This SENSE-method is discussed in more detail in the international application no. WO 99/54746-A1. Alternatively, the sub-sampled MR-signals may be combined into combined MR-signals which provide sampling of k-space corresponding to the full field-of-view. In particular, according to the so-called SMASH-method sub-sampled MR-signals approximate low-order spherical harmonics which are combined according to the sensitivity profiles. The SMASH-method is known as such from the international application no. WO 98/21600. Sub-sampling may also be carried-out spatially. In that case the spatial resolution of the MR-signals is less than the resolution of the magnetic resonance image and MR-signals corresponding to a full resolution of the magnetic resonance image are formed on the basis of the sensitivity profile. Spatial sub-sampling is in particular achieved in that MR-signals in separate signal channels, e.g. from individual receiver coils, form a combination of contributions from several portions of the object. Such portions are for example simultaneously excited slices. Often the MR-signals in each signal channel form linear combinations of contributions from several portions, e.g. slices. This linear combination involves the sensitivity profile associated with the signal channels, i.e. of the receiver coils. Thus, the MR-signals of the respective signal channels and the MR-signals of respective portions (slices) are related by a sensitivity matrix which represents weights of the contribution of several portions of the object in the respective signal channels due to the sensitivity profile. By inversion of the sensitivity matrix, MR-signals pertaining to respective portions of the object are derived. In particular MR-signals from respective slices are derived and magnetic resonance images of these slices are reconstructed.

According to the invention the receiving coils are preferably arranged in such a manner that there is no or hardly any overlap between the sensitivity profiles of the individual receiving coils. Furthermore, the receiving coils are preferably rigidly arranged relative to the patient to be examined. Thus, the coil sensitivity profile will not be influenced by motion, notably not by respiration of the patient to be examined.

These and other aspects of the invention will be elaborated on the basis of the following embodiments which are defined in the dependent claims.

Preferably, one or more successive RF excitation pulses are generated. Each of these RF excitation pulses generates a series of magnetic resonance signals, for example gradient MR echo signals. Individual lines in the so-called k space are scanned by the individual magnetic resonance signals. The k space is the reciprocal space associated with the two-dimensional or three-dimensional geometrical space on which the magnetic resonance image is defined. The k space is scanned by the magnetic resonance signals on the basis of the wave vector of the magnetic resonance signals. Preferably, the magnetic resonance signals scan parallel straight lines in the k space. The position along the individual lines in the k space is then encoded in conformity with the frequency of the magnetic resonance signals and the relative position of the individual lines in the k space is encoded on the basis of the (mutual) phase of the magnetic resonance signals. However, it is to be noted that scanning is also possible along other trajectories in the k space, for example curved lines such as arcs of circle or spirals, but in that case more complex frequency and phase encoding of the magnetic resonance signals will be required. Furthermore, it is also possible, for example, to scan the k space along radially extending radii from or through a preselected center (such as k=0) to the edge of the scanned part of the k space. Such radial scanning offers comparatively fine sampling in a region in the vicinity of the preselected center. By selecting the center to be situated at k=0, magnetic resonance signals representing contrast and coarse structures will be acquired with less sub-sampling than the magnetic resonance signals representing fine structures. The spacing of the individual lines is controlled by way of the strengths of the phase encoding gradients applied between the acquisition of the magnetic resonance signals in a series. The scanning of the k space is thus segmented; lines in the k space which are scanned by magnetic resonance signals which are mainly due to one and the same RF excitation pulse thus belong to one and the same segment of the k space. It has been found that it is very advantageous to control the strengths of the phase encoding gradients in such a manner that the lines in the k space which are scanned by magnetic resonance signals of one and the same series are situated further apart than the lines in the k space which are scanned by magnetic resonance signals from different series. To this end, the phase encoding gradients applied between the acquisition of the magnetic resonance signals in the same series have a comparatively high amplitude. For example, in an Echo Planar Imaging (EPI) sequence the phase encoding gradients are applied as so-called blip gradient pulses which on average have a gradient strength which amounts to approximately a fraction of the read-out gradients which are applied without sub-sampling with the given resolution so as to perform frequency encoding of the magnetic resonance signals in the read-out direction. The ratio of the gradient strengths of the blip gradient pulses to the read-out gradient is inversely proportional to the number of lines to be scanned in the k space for the given spatial resolution and field of view of the magnetic resonance image. This ratio, moreover, is proportional to the degree of sub-sampling and to the degree of segmentation. This will be explained in detail hereinafter by way of a comparison with a conventional EPI sequence. Such a conventional EPI sequence utilizes blip gradient pulses of amplitude $G_b^c$ and read-out gradients of amplitude $G_r^c$. When N lines are scanned in the k space, it holds approximately that $$\frac{G_b^c}{G_r^c} = \frac{1}{N}.$$

According to one version of the invention, it is advantageous to utilize, for example, a segmentation in p segments and also the SENSE technique with a SENSE reduction factor R in the phase encoding direction. The same read-out gradient is then used as in the conventional EPI sequence, and there is applied a phase encoding gradient of higher amplitude $G_b^{s,R}$ for which it holds that $$\frac{G_b^{s,R}}{G_r^c} = \frac{pR}{N}.$$

Because blip gradients are used which are relatively strong in comparison with the blip gradient pulses in a conventional EPI sequence, the relative phase errors between the magnetic resonance signals of successive lines in individual series are reduced. Generally speaking, such phase errors are caused by unintentional inhomogeneities in the steady magnetic field or by local variations in the magnetic susceptibility of the object to be examined. Moreover, the relative effect of undesirable gradient fields, caused by electric eddy currents, is also substantially reduced. Such electric eddy currents are generated, for example due to the switching of gradient fields whereby nuclear spins in the object are conditioned so as to influence the contrast in the magnetic resonance image. These gradient fields are notably bipolar gradients which are used in the formation of diffusion magnetic resonance images. Because sub-sampling is used, moreover, a magnetic resonance image having a high spatial resolution can still be derived by means of a comparatively small number of lines scanned in the k space, so by acquisition of a comparatively small number of magnetic resonance signals. This means that small details are suitably distinctly reproduced in the magnetic resonance image. It is thus achieved notably that the number of RF excitations required to generate the series of magnetic resonance signals is comparatively small. As the number of RF excitations is smaller, i.e. as the number of segmentations of the k space is smaller, less time will be required for the acquisition of the magnetic resonance signals. As a result, the magnetic resonance image will contain hardly any or no disturbances which are due notably to motion in or of the patient to be examined.

Preferably, the number of RF excitations to be executed and the number of magnetic resonance signals in the individual series are adjustable. This means that the number of segments in which the k space is scanned and the number of lines per segment are also adjustable. The diagnostic quality of the magnetic resonance image is thus optimized in respect of the circumstances in which the magnetic resonance signals are acquired. Moreover, disturbances in the magnetic resonance image which are due to slight motions in or of the patient to be examined are counteracted since the duration of such motions is significantly longer than the acquisition time of the magnetic resonance signals. It is notably possible to keep the number of RF excitations so small that the time required to acquire the series of magnetic resonance signals is so short that a given, short phase of a dynamic process taking place in the object is accurately reproduced in the magnetic resonance image. For example, the number of RF excitations is kept so small that the time required to acquire the magnetic resonance signals for the magnetic resonance image is shorter than a characteristic time scale at which significant changes relating to the dynamic process occur. In the context of the present application this characteristic time scale is referred to as the process time. For example, the process time of turbulent flow of blood through the heart and the blood vessels from and to the heart amounts to approximately from 10 to 50 ms. Another example concerns the passage of blood with a quantity of contrast agent through a part of the vascular system where the process time amounts to from 0.5 to 1 s. As a somewhat larger number of RF excitations is used, i.e. as the k space is scanned in more segments, it will become possible to keep the individual series of magnetic resonance signals, generated mainly by respective RF excitations, shorter. The signal decay, for example due to dephasing of the excited spins, can thus be reduced. Because the number of RF excitations and the number of lines scanned per series of magnetic resonance signals are adjustable, a suitable compromise can be found between adequate limitation of the signal decay per series of magnetic resonance signals and limitation of the number of RF excitations, said compromise being dependent on the circumstances in which a magnetic resonance image is formed. For example, despite fast variations such as fast motions in the patient to be examined, a magnetic resonance image of high diagnostic quality can still be formed in this manner, and the signal decay in the individual series of magnetic resonance signals can also be kept limited. Various sequences of RF pulses and gradient fields are suitable for the generation and acquisition of the series of magnetic resonance signals; suitable examples of such sequences are Turbo Spin Echo (TSE), Echo Planar Imaging (EPI), Gradient Spin Echo (GRASE), each of which is known per se to those skilled in the art of magnetic resonance imaging. The invention can also be advantageously used in combination with so-called "steady state" gradient echo sequences such as Fast Field Echo (FFE). Such steady state gradient sequences offer the advantage of a further reduction of the acquisition time and hence are particularly suitable for use in MR angiography.

Particularly attractive results are obtained by applying the invention in conjunction with an EPI (Echo Planar Imaging) sequence. The EPI sequence is known per se, for example from the book "Magnetic resonance imaging" by M. T. Vlaardingerbroek and J. A. den Boer (section 3.3). The EPI sequence generates gradient MR echo signals which are used to scan parallel lines successively in the k space. During the scanning of the k space, blip gradient pulses are applied in the phase encoding direction at regular instants in order to vary the amplitude of the components in the phase encoding direction of the wave vector of the gradient MR echo signals in a more or less stepped fashion. According to the invention, despite the sub-sampling by scanning only a small number of lines in the k space, a magnetic resonance image which has a high spatial resolution and is substantially free from aliasing effects can still be derived from the gradient MR echo signals. The lines to be scanned are situated at a comparatively large distance from one another in the k space. This is achieved by utilizing blip gradient pulses of a comparatively high amplitude. The blip gradient pulses applied according to the invention have an amplitude which is higher than the amplitude of the blip gradient pulses used in the known EPI sequences where notably the magnetic resonance signals are acquired with complete sampling. The relative phase errors between the magnetic resonance signals of successive lines in individual series are thus reduced. It is also achieved that only a small amount of time will be required so as to acquire the comparatively small number of gradient MR echo signals, a magnetic resonance image of high diagnostic quality being obtained nevertheless.

The invention also relates to a magnetic resonance imaging method for forming one or more magnetic resonance images relating to a dynamic process. Such a dynamic process becomes manifest as changes which occur in the object to be examined and are reproduced in successive magnetic resonance images of the object. Such changes take place at a time scale which is referred to as the process time. During the process time significant changes occur which lead to significant differences in the successive magnetic resonance images. Hardly any changes due to the relevant dynamic process occur during periods of time which are significantly shorter than the process time. An example of such a dynamic process is perfusion with contrast agents in order to study the blood circulation in given organs such as the brain. Another example of a dynamic process concerns the motions which occur in the body of the patient to be examined due to the breathing and/or the heart beat. It has been found notably that a magnetic resonance imaging method according to the invention is suitable to form magnetic resonance images of fast dynamic processes.

Preferably, use is made of a high degree of sub-sampling and scanning of the k space with a small number of segments. It has even been found that it is possible to use such a high degree of sub-sampling that the k space is scanned with a small number of lines in a single segment. The sub-sampling enables the acquisition of the magnetic resonance signals which are used to reconstruct the magnetic resonance image within a short acquisition time. As the degree of sub-sampling used for the magnetic resonance signals is higher, the acquisition time will be shorter. It has been found that one or more magnetic resonance images of suitable diagnostic quality can be made of fast dynamic processes by utilizing sub-sampling such that the acquisition time is shorter (preferably significantly shorter) than the process time. Furthermore, disturbances in the magnetic resonance image which are due to dynamic processes are effectively avoided by such sub-sampling corresponding to an acquisition time which is much shorter than the process time. Reconstructing the magnetic resonance image (also) on the basis of the spatial coil sensitivity profile of the set of receiving coils offers a high spatial resolution of the magnetic resonance image, despite the sub-sampling used to scan the k space by means of the magnetic resonance signals. It has been found that magnetic resonance images of the heart of the patient which beats at an increased rate, for example during physical labor, can be formed with a high temporal resolution in a time resolved manner. Suitable results are obtained, for example by sub-sampling according to the SENSE technique with a SENSE reduction factor $R=2.8$ and by reconstructing the magnetic resonance image in a 64×64 matrix with a field of view of 250 mm, so that the spatial resolution amounts to 4 mm. The magnetic resonance signals are then acquired in an EPI sequence in which a single RF excitation is generated and 15 gradient echo MR signals are acquired in approximately 13 ms. Suitable results are also obtained, for example by utilizing 2 or 3 RF excitations in the EPI sequence and by acquiring from 7 to 9 gradient MR echo signals after each of the RF excitations. When a SENSE reduction factor R of between 2.5 and 3.3 is applied and the magnetic resonance images are reconstructed in a 100×128 matrix with a field of view of approximately 320 mm, suitable results are obtained, because the temporal resolution amounts to approximately from 30 to 35 ms with a spatial resolution of from 2.5 to 3.2 mm.

In a further version the invention is used for the formation of a series of magnetic resonance images or of a single magnetic resonance image of the patient to be examined whereto a contrast agent is administered. For example, the invention is successfully used in MR angiography for imaging a part of the vascular system of the patient to be examined in the magnetic resonance image (images). To this end, a predetermined quantity of a contrast agent which preferably contains gadolinium is administered to the patient by means of a preadjusted administration of contrast. In practice the contrast agent is injected into a vein, after which the heart pumps the blood with the contrast agent to an organ to be studied. The administration of contrast concerns the concentration in which the contrast agent is administered to the patient to be examined. Generally speaking, the contrast agent contains an active substance, such as a gadolinium compound, dissolved in a solvent. The administration of contrast can be controlled, for example by adaptation of the concentration of active substance, but also by adaptation of the rate at which the contrast agent is injected. This means the adaptation of the amount of active substance per volume unit of blood in the organ to be examined. Furthermore, the total quantity of active substance of the contrast agent administered to the patient is usually chosen in advance. When the blood with the contrast agent has reached the organ to be examined, an RF excitation pulse is generated and the magnetic resonance signals are acquired with a given degree of sub-sampling. The magnetic resonance images of the relevant organ are derived from the magnetic resonance signals and the spatial coil sensitivity profile. The magnetic resonance images are acquired, for example by means of the SENSE technique or the SMASH technique. A suitable signal-to-noise ratio is achieved for the resonance image by adjusting the administration of the contrast agent on the basis of the degree of sub-sampling used to scan the k space by means of the magnetic resonance signals. Preferably, the administration of contrast agent is increased as the degree of sub-sampling is higher. Because of the sub-sampling, comparatively few magnetic resonance signals are received, i.e. few signals in comparison with complete sampling; if no steps are taken, the signal-to-noise ratio of the reconstructed magnetic resonance image will be less than in the case of complete sampling. By increasing the administration of contrast agent, for example by increasing the concentration of active substance or by injecting at a higher rate, the signal level of the received magnetic resonance signals is increased so that the signal-to-noise ratio increases in the part of the magnetic resonance image in which the blood vessels filled with the contrast agent are reproduced. The signal level increases notably because, due to the higher contrast agent administration, the $T_1$ relaxation time of the blood with contrast agent in the blood vessels to be imaged becomes shorter. Thus, the diagnostic quality of the magnetic resonance image is improved also in MR angiography. It is to be noted that the so-called Ernst angle of the RF excitation (excitations) is preferably adapted to the expected value of the $T_1$ decay time during the passage of the contrast medium. Suitable results are obtained notably by increasing the contrast agent administration in direct proportion to the degree of sub-sampling. A suitable signal-to-noise ratio is thus achieved for the magnetic resonance image while the dose of contrast agent administered to the patient nevertheless remains amply below the acceptable maximum value. It has been found that the $T_1$ decay time of the magnetization of blood with contrast agent is dependent on the concentration of the contrast agent in the blood, so that the $T_1$ decay time is related to the injection speed s of the contrast agent for a given concentration of active substance, where $$T_1 \propto \frac{1}{s}.$$

Furthermore, when use is made of RF excitations where the magnetization is rotated through the so-called Ernst angle, the signal level of the magnetic resonance signals is dependent on the $T_1$ decay time in conformity with M $1/\sqrt{T_1} \sqrt{s}$. The signal-to-noise ratio SNR of the magnetic resonance image increases as more magnetic resonance signals are used so as to reconstruct the magnetic resonance image therefrom. It then holds approximately that $$SNR \approx \frac{1}{\sqrt{n}},$$

where n indicates the number of magnetic resonance signals. In conformity with the invention, the reduction of the signal-to-noise ratio which is due to a smaller number of magnetic resonance signals which is due to the sub-sampling can be compensated by adapting the administration of the contrast agent such that the signal level of the magnetic resonance signals is increased.

The administration of the contrast agent is a technical step whereby one or more magnetic resonance images are reconstructed in which the circulation in the imaged part of the vascular system is clearly reproduced. Such a magnetic resonance image is a useful tool for a physician so as to make a diagnosis concerning the functioning of the vascular system of the patient to be examined.

The invention also relates to a magnetic resonance imaging system. It is an object of the invention to provide a magnetic resonance imaging system for carrying out the magnetic resonance imaging methods according to the invention. The functions of a magnetic resonance imaging system according to the invention are preferably carried out by means of a suitably programmed computer or (micro) processor or by means of a special purpose processor provided with integrated electronic or opto-electronic circuits especially designed for the execution of one or more of the magnetic resonance imaging methods according to the invention.

The invention also relates to a computer program with instructions for executing a magnetic resonance imaging method. It is a further object of the invention to provide a computer program whereby one or more of the magnetic resonance imaging methods according to the invention can be carried out. When such a computer program according to the invention is loaded into the computer of a magnetic resonance imaging system, the magnetic resonance imaging system will be capable of executing one or more magnetic resonance imaging methods according to the invention. For example, a magnetic resonance imaging system according to the invention is a magnetic resonance imaging system whose computer is loaded with a computer program according to the invention. Such a computer program can be stored on a carrier such as a CD-ROM. The computer program is then loaded into the computer by reading the computer program from the carrier, for example by means of a CD-ROM player, and by storing the computer program in the memory of the computer of the magnetic resonance imaging system.

BRIEF DESCRIPTION OF THE DRAWINGS

These and other aspects of the invention are apparent from and will be elucidated, by way of non-limitative example, with reference to the embodiments described hereinafter and the accompanying drawing; therein

DESCRIPTION OF THE PREFERRED EMBODIMENTS

Figure 1:
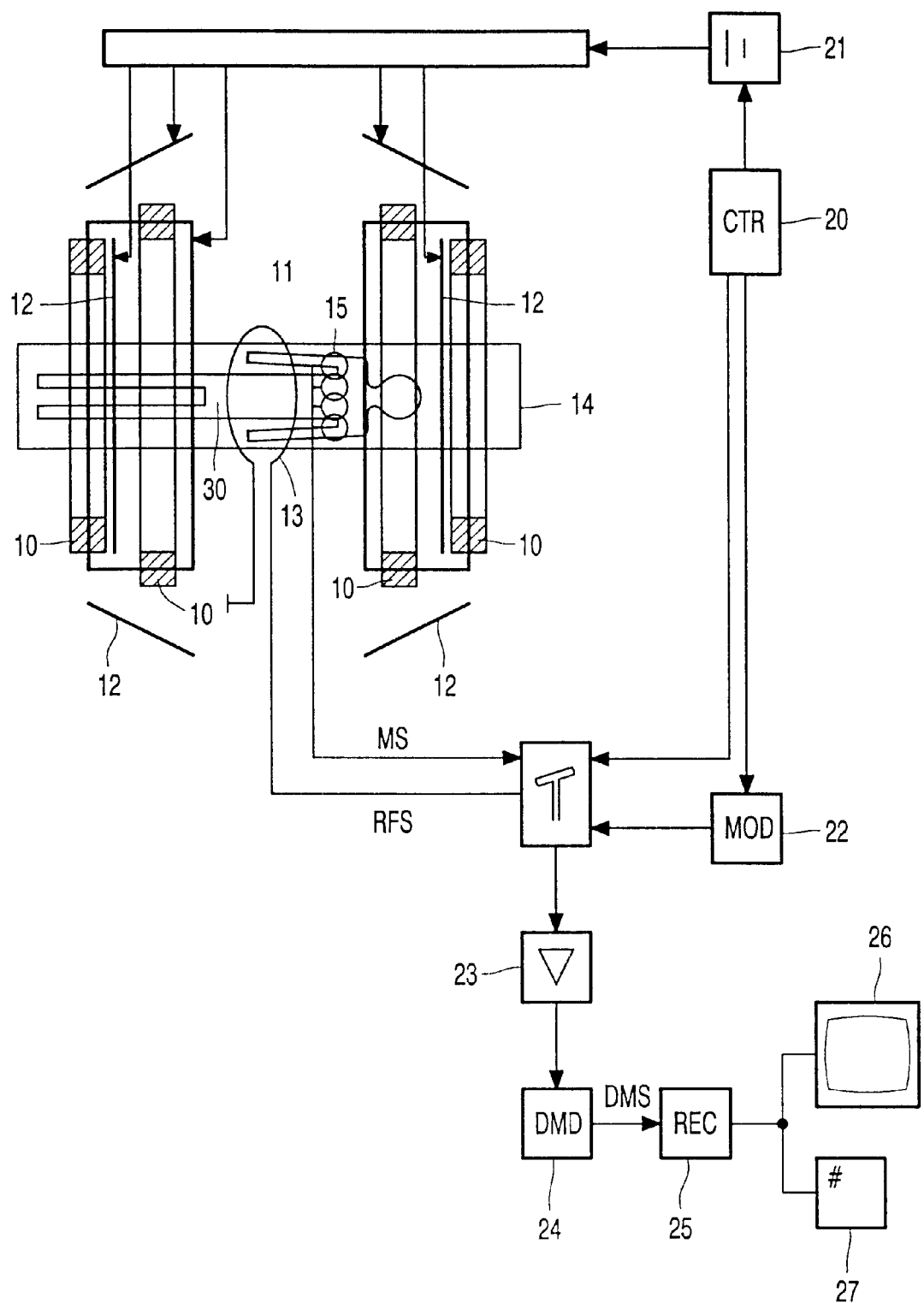
FIG. 1 shows diagrammatically a magnetic resonance imaging system in which the invention is used.

FIG. 1 shows diagrammatically a magnetic resonance imaging system in which the invention is used.

The magnetic resonance imaging system includes a set of main coils 10 whereby the steady, uniform magnetic field is generated. The main coils are constructed, for example in such a manner that they enclose a tunnel-shaped examination space. The patient to be examined is slid into this tunnel-shaped examination space. The magnetic resonance imaging system also includes a number of gradient coils 11, 12 whereby magnetic fields exhibiting spatial variations, notably in the form of temporary gradients in individual directions, are generated so as to be superposed on the uniform magnetic field. The gradient coils 11, 12 are connected to a controllable power supply unit 21. The gradient coils 11, 12 are energized by application of an electric current by means of the power supply unit 21. The strength, direction and duration of the gradients are controlled by control of the power supply unit. The magnetic resonance imaging system also includes transmission and receiving coils 13, 15 for generating the RF excitation pulses and for picking up the magnetic resonance signals, respectively. The transmission coil 13 is preferably constructed as a body coil whereby (a part of) the object to be examined can be enclosed. The body coil is usually arranged in the magnetic resonance imaging system in such a manner that the patient 30 to be examined, being arranged in the magnetic resonance imaging system, is enclosed by the body coil 13. The body coil 13 acts as a transmission aerial for the transmission of the RF excitation pulses and RF refocusing pulses. Preferably, the body coil 13 involves a spatially uniform intensity distribution of the transmitted RF pulses. The receiving coils 15 are preferably surface coils 15 which are arranged on or near the body of the patient 30 to be examined. Such surface coils 15 have a high sensitivity for the reception of magnetic resonance signals which is also spatially inhomogeneous. This means that individual surface coils 15 are mainly sensitive for magnetic resonance signals originating from separate directions, i.e. from separate parts in space of the body of the patient to be examined. The coil sensitivity profile represents the spatial sensitivity of the set of surface coils. The transmission coils, notably surface coils, are connected to a demodulator 24 and the received magnetic resonance signals (MS) are demodulated by means of the demodulator 24. The demodulated magnetic resonance signals (DMS) are applied to a reconstruction unit. The reconstruction unit reconstructs the magnetic resonance image from the demodulated magnetic resonance signals (DMS) and on the basis of the coil sensitivity profile of the set of surface coils. The coil sensitivity profile has been measured in advance and is stored, for example electronically, in a memory unit which is included in the reconstruction unit. The reconstruction unit derives one or more image signals from the demodulated magnetic resonance signals (DMS), which image signals represent one or more, possibly successive magnetic resonance images. This means that the signal levels of the image signal of such a magnetic resonance image represent the brightness values of the relevant magnetic resonance image. The reconstruction unit 25 in practice is preferably constructed as a digital image processing unit 25 which is programmed so as to reconstruct the magnetic resonance image from the demodulated magnetic resonance signals and on the basis of the coil sensitivity profile. The digital image processing unit 25 is notably programmed so as to execute the reconstruction in conformity with the so-called SENSE technique or the so-called SMASH technique. The image signal from the reconstruction unit is applied to a monitor 26 so that the monitor can display the image information of the magnetic resonance image (images). It is also possible to store the image signal in a buffer unit 27 while awaiting further processing, for example printing in the form of a hard copy.

In order to form a magnetic resonance image or a series of successive magnetic resonance images of the patient to be examined, the body of the patient is exposed to the magnetic field prevailing in the examination space. The steady, uniform magnetic field, i.e. the main field, orients a small excess number of the spins in the body of the patient to be examined in the direction of the main field. This generates a (small) net macroscopic magnetization in the body. These spins are, for example nuclear spins such as of the hydrogen nuclei (protons), but electron spins may also be concerned. The magnetization is locally influenced by application of the gradient fields. For example, the gradient coils 12 apply a selection gradient in order to select a more or less thin slice of the body. Subsequently, the transmission coils apply the RF excitation pulse to the examination space in which the part to be imaged of the patient to be examined is situated. The RF excitation pulse excites the spins in the selected slice, i.e. the net magnetization then performs a precessional motion about the direction of the main field. During this operation those spins are excited which have a Larmor frequency within the frequency band of the RF excitation pulse in the main field. However, it is also very well possible to excite the spins in a part of the body which is much larger than such a thin slice; for example, the spins can be excited in a three-dimensional part which extends substantially in three directions in the body. After the RF excitation, the spins slowly return to their initial state and the macroscopic magnetization returns to its (thermal) state of equilibrium. The relaxing spins then emit magnetic resonance signals. Because of the application of a read-out gradient and a phase encoding gradient, the magnetic resonance signals have a plurality of frequency components which encode the spatial positions in, for example the selected slice. The k space is scanned by the magnetic resonance signals by application of the read-out gradients and the phase encoding gradients. According to the invention, the application of notably the phase encoding gradients results in the sub-sampling of the k space, relative to a predetermined spatial resolution of the magnetic resonance image. For example, a number of lines which is too small for the predetermined resolution of the magnetic resonance image, for example only half the number of lines, is scanned in the k space.

Figure 2:
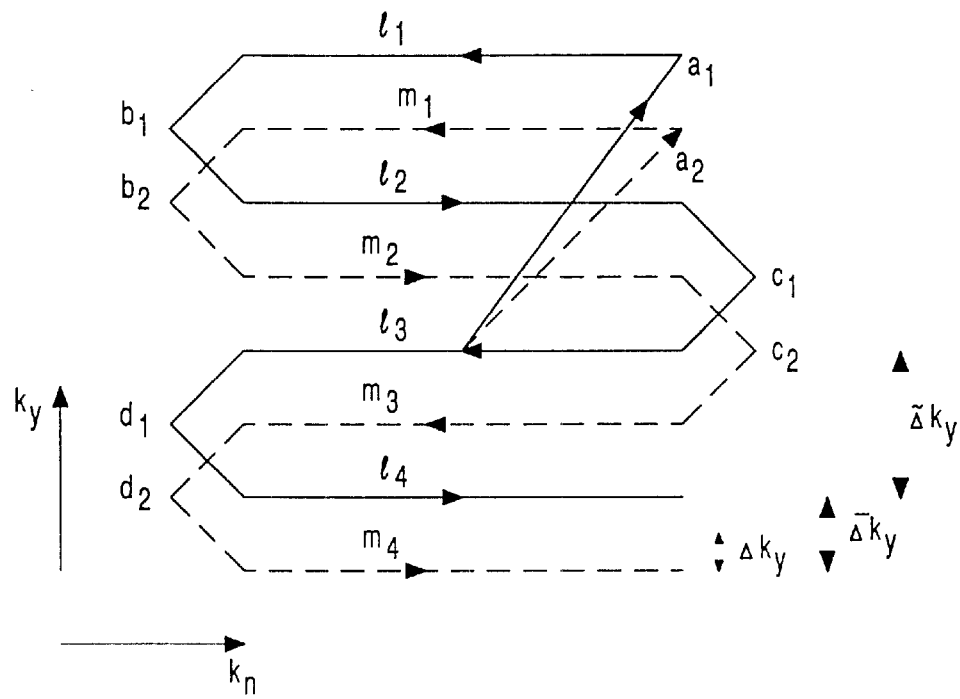
FIG. 2 shows an example of the scanning of the k space which corresponds to the EPI sequence shown in FIG. 3.
Figure 3:
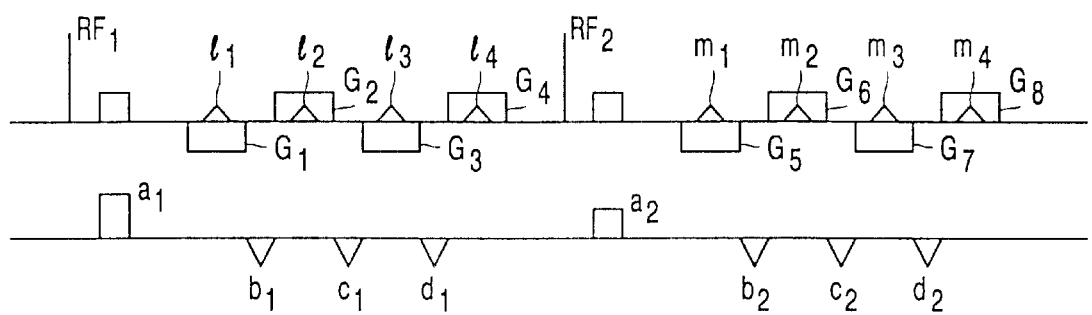
FIG. 3 shows an EPI sequence with the temporal succession of RF excitation pulses and gradients according to the invention which corresponds to the scanning illustrated in FIG. 2.

FIG. 2 shows an example of the scanning of the k space which corresponds to the EPI sequence shown in FIG. 3. FIG. 2 shows the path followed through the k space by the variation of the two-dimensional wave vector $$\begin{pmatrix} k_x \\ k_y \end{pmatrix}.$$

By way of example, the scanning according to FIG. 2 involves two segmentations of four lines each. Thus, eight lines are scanned in total. In a practical magnetic resonance imaging method many more lines are scanned, even in the case of sub-sampling. When data is required for 128 lines in the k space in the case of a given field of view, it suffices (by using the SENSE technique), for example, to pick up data for 64 lines only. This means that the SENSE reduction factor R=2 is used. For example, these 64 lines can be scanned in a single segmentation of 64 lines, in two segments of 32 lines or in four segments of 16 lines. Per segment an individual RF excitation pulse is generated and the respective lines are scanned on the basis of the magnetic resonance signals generated by the individual RF excitations. In the example shown in FIG. 2, the lines $l_1, l_2, l_3$ and $l_4$ are scanned after the first RF excitation. After the second RF excitation, the lines $m_1, m_2, m_3$ and $m_4$ are scanned. By way of reference FIG. 2 shows the resolution in the k space as $\overline{\Delta k_y}$, which is necessary for the required resolution of the magnetic resonance image. The lines which are scanned within a separate segment are spaced $\Delta k_y$ apart and the smallest distance between two scanned lines in the k space amounts to $\overline{\Delta} k_y$. The sub-sampling applied in the $k_y$ direction is represented by the SENSE reduction factor R, i.e. $\Delta k_y = R \overline{\Delta} k_y = 2 \Delta k_y$. In the $k_x$ direction the scan is performed by application of a read-out gradient, complete sampling then being performed. Furthermore, the sampling is such that lines which are scanned in the same segment are spaced further apart than lines scanned in different segmentations. In the example of FIG. 2, $\Delta k_y = 2 \overline{\Delta} k_y = 4 \Delta k_y$. The change-over from one line to another in individual segmentations is performed by application of blip gradient pulses in the $k_y$ direction as indicated for b1, c1, d1 in FIG. 2. The comparatively large distance between the lines in the individual segmentations in the k space means that comparatively strong blip gradient pulses are used. In the example shown in FIG. 2 the strength of the blip gradient pulses amounts to four times that of the blip gradient pulses that would be used in order to change over between lines that are situated a distance $\Delta k_y$ from one another.

FIG. 3 shows an EPI sequence with the temporal series of RF excitation pulses and gradients according to the invention which corresponds to the scan shown in FIG. 2. The first segmentation commences with the first RF excitation pulse RF1, for example a 90° pulse or an RF excitation pulse for rotating the magnetization through the so-called Ernst angle. Subsequently, read-out gradient pulses G1–G4 in the read-out direction ($k_x$) generate MR echo signals 11 to 14 whereby the lines 11 to 14 are scanned. After the individual RF excitation pulses RF1, RF2 and the subsequent read-out gradient pulses G1, G5, initial phase encoding gradients a1, a2 are applied. These initial phase encoding gradients determine the individual starting points of the scan in the respective segmentation. When it is ensured that the individual initial phase encoding gradients have different time integrals, it is achieved that the starting points of the scans in the respective segmentations are shifted relative to one another. It is thus achieved that the scanned lines of the respective segmentations are situated between one another. Between the read-out gradient pulses blip gradient pulses b1, c1 and d1 are applied in the phase encoding direction ($k_y$) in order to change over to each time a next line in the k space. After the second RF excitation RF2, read-out gradient pulses G5 to G8 generate MR echo signals whereby the lines m1 to m4 are scanned. Blip gradient pulses b2, c2 and d2 are applied between the read-out gradients G5 to G8 in order to change over from one line to the next in the second segmentation.

What is claimed is:

1. A magnetic resonance (MR) imaging method, comprising the steps of:
   generating an RF excitation pulse;
   acquiring, in a sub-sampled fashion, a series of MR signals by means of a set of at least one receiving coil during an acquisition time; and
   deriving an MR image from the sub-sampled MR signals on the basis of a pre-measured memory-stored spatial coil sensitivity of each coil of the set of at least one receiving coil;
   wherein a degree of sub-sampling is chosen such that the acquisition time remains below a predetermined upper limit, which upper limit being a predetermined function of a decay time in which a significant decay of the MR signal occurs.

2. The MR imaging method set forth in claim 1, wherein the decay time amounts to the dephasing time of spins emitting the MR signals.

3. A magnetic resonance (MR) imaging method, comprising the steps of:
   generating at least successive RF excitation pulses;
   acquiring, in a sub-sampled fashion, successive series of MR signals by means of a set of at least one receiving coil during an acquisition time, where each of said successive series corresponds to each said successive RF excitation pulses; and
   deriving an MR image from the sub-sampled MR signals on the basis of a pre-measured memory-stored spatial coil sensitivity of each coil of the set of at least one receiving coil;
   wherein the successive MR signals are acquired and the phase encoding gradients are applied such that individual lines in k space are scanned by the individual MR signals, and the lines in k space scanned by the MR signals of with the same series are at positions which are further apart than lines in k space scanned by MR signals within different series.

4. The MR imaging method as set forth in claim 3, wherein the step of generating further comprises that the number of RF excitation pulses and the number of lines scanned in k space per series is adjustable in advance in accordance with a total number of scanned lines.

5. The MR imaging method as set forth in claim 3, wherein said step of deriving is varied in accordance with a dynamic process which significantly varies over a process time, including adjusting a number of RF excitation pulses such that an the acquisition time in which the MR signals are acquired defines that same MR signals are acquired in a sub-sampled manner which is shorter that the process time.

6. The MR method set forth in claim 3, wherein the step of acquiring further comprises:
   acquiring the MR signals by an EPI gradient pulse sequence with an alternation of blip gradient pulses in a phase encoding direction and read-out gradient pulses in a read-out direction;
   wherein the MR signals for each series of scanned lines constitute a measuring group;
   wherein the blip gradient pulses have a blip [pulse duration (Tb) and the read-out gradients have a read-out pulse duration (T1) such that the acquisition time amounts to a product of the number of lines in the measuring group and the sum of the blip-pulse duration and the read-out pulse duration; and
   wherein a ceiling value of the number of lines in the measuring group is such that the acquisition time is below the upper limit, which upper limit is a predetermined function of a decay time in which a significant decay of the MT signals occurs.

7. A magnetic resonance (MR) imaging method in which a dynamic process defining said MR imaging varies within a process time, the dynamic process comprising the steps of
   generating at least one RF excitation pulse;
   acquiring, in a sub-sampled fashion, a series of MR signals by means of a set of at least one receiving coil during an acquisition time; and
   deriving an MR image from the sub-sampled MR signals on the basis of a pre-measured memory-stored spatial coil sensitivity of each coil of the set of at least one receiving coil;
   wherein a degree of sub-sampling is chosen such that the acquisition time remains below a predetermined upper limit, which upper limit being a predetermined function of a decay time in which a significant decay of the MR signal occurs, and wherein a significant variation of the dynamic process is implemented during said process time.

* * * * *